United States Patent [19]

Lawson et al.

[11] Patent Number: 5,682,913
[45] Date of Patent: *Nov. 4, 1997

[54] VAPOR RINSE-VAPOR DRY PROCESSING TOOL

[75] Inventors: Margaret Jane Lawson, Poughkeepsie, N.Y.; Edward Joseph Leonard, Milton, Vt.; Jon Howard Nansen, Clinton Corners, N.Y.

[73] Assignee: International Business Machines Corporation, Armonk, N.Y.

[*] Notice: The term of this patent shall not extend beyond the expiration date of Pat. No. 5,454,390.

[21] Appl. No.: 446,358

[22] Filed: May 22, 1995

Related U.S. Application Data

[63] Continuation of Ser. No. 242,912, May 16, 1994, Pat. No. 5,454,390.

[51] Int. Cl.$^6$ ............................................. B08B 3/10
[52] U.S. Cl. ................ 134/56 R; 134/105; 134/108; 134/107; 134/200
[58] Field of Search ................................... 134/105, 107, 134/108, 200, 56 R; 68/18 C

[56] References Cited

U.S. PATENT DOCUMENTS

| | | | |
|---|---|---|---|
| 1,875,937 | 9/1932 | Savage . | |
| 3,111,952 | 11/1963 | Roehl . | |
| 4,008,729 | 2/1977 | Chizinsky | 137/107 |
| 4,424,633 | 1/1984 | Bernhardt et al. | 134/105 |
| 4,973,387 | 11/1990 | Osterman et al. | 134/105 |
| 5,048,548 | 9/1991 | Ramsey et al. | 134/105 |
| 5,143,103 | 9/1992 | Basso et al. | 134/105 |
| 5,301,701 | 4/1994 | Nafziger | 134/108 |
| 5,415,193 | 5/1995 | Taricco | 134/108 |

FOREIGN PATENT DOCUMENTS

| | | | |
|---|---|---|---|
| 889827 | 1/1972 | Canada | 134/105 |
| 1947070 | 8/1970 | Germany | 134/107 |
| 137894 | 10/1979 | Germany | 134/107 |

*Primary Examiner*—Frankie L. Stinson
*Attorney, Agent, or Firm*—Aziz M. Ahsan; Charles W. Peterson, Jr.

[57] ABSTRACT

A cleaning apparatus for cleaning chemically processed articles between chemical processing steps. The cleaning apparatus includes a sealable pressurization vessel. After a chemical process step, an article, such as a semiconductor wafer is placed in the vessel. The vessel is sealed. Vessel pressure is adjusted. Solvent in the vessel is heated to a boil forming a vapor. Solvent vapor is recondensed by a primary condensing coil. Condensed solvent rains onto the article, washing it. After the article is clean, it is dried when a secondary condensing coil condenses the solvent vapor, causing the distilled solvent to rain into and be collected by a collection tray. Collected solvent is channelled into a storage reservoir. The storage reservoir is sealed after all of the solvent is collected. The vessel is opened to remove the cleaned article.

6 Claims, 4 Drawing Sheets

VAPOR RINSE-VAPOR DRY PROCESSING TOOL

This is a continuation patent application of U.S. patent application Ser. No. 08/242,912, filed on May 16, 1994, now U.S. Pat. No. 5,454,390.

FIELD OF THE INVENTION

The present invention is related to cleaning an article of manufacture and more particularly to cleaning residue and impurities from a chemically manufactured article, particularly in semiconductor manufacturing.

BACKGROUND OF THE INVENTION

In semiconductor manufacturing, as well as in other manufacturing processes wherein articles are chemically processed, chemicals must be cleaned from the processed article. Where the manufacturing process requires sequentially subjecting the article to several different individual chemicals, cleaning the article between chemical steps becomes especially important. For such a multi-step chemical process, cleaning is required to prevent reaction between chemicals used in processing, to prevent introduction of containments to subsequent solutions and to minimize defects formed on the article.

For example, in forming integrated circuits on a semiconductor wafer, there are several individual steps wherein the wafer is treated chemically. These steps may include developing photoresist, etching photoresist, growing oxide, and etching circuit layers. Each chemical used in a processing step (etchant, developer, etc.) may leave residue on the wafer. The residue remains until it is removed. For example, loose metal fragments (removed from the wafer during, say, an acid bath) may settle on the wafer and, so, must be cleaned off.

Typically, the wafer is passed through a series of solvent tanks to wash off the residue. At each tank, slightly less containment or residue is washed off than in the previous tank. As it is cleaned off, the contaminant remains in the cleaning solution. The final rinse is in a tank of De-Ionized (DI) water. After being rinsed in the final rinse tank, the wafer is spin dried or vapor dried.

Unfortunately, each cleaned wafer deposits contaminants in the cleaning solution in each stage. A phenomena known as cascade effect occurs when cleaning solution contamination cascades from one tank to the next, so that increasingly more cleaning stages became contaminated and fewer are left that are suitable for cleaning wafers. Eventually, because more contaminant is cleaned off in the early stages, the cleaning solution becomes so contaminated that very little is cleaned from the wafer there. So, instead of being rinsed off in the early stages, the wafers carry contaminant to subsequent stages, which also eventually become too contaminated to clean. Because of cascade effect in prior art chemical processes, contaminated solvent is replaced, continuously. Also, every time a cleaning tank was opened, solvent was contaminated with atmospheric pollutants (dust, gas etc.). So, each time wafers were transferred from one cleaning tank to the next, the solutions in both tanks become polluted from the atmosphere.

Consequently, for prior art cleaning processes, because cleaning chemically processed articles required several cleaning tanks for each step, each tank had to be capable of holding large amounts of solvent to minimize the effect of solvent contamination from each cleaned article. Each of these cleaning tanks required a large amount of manufacturing floor space. Solvent, also, had to be replaced continually because, contaminated solvent could not clean effectively. So, large volumes of solvent, requiring additional floor space, had to be stored for replacement.

PURPOSES OF THE INVENTION

It is a purpose of the invention to reduce contamination in chemical processing.

It is another purpose of the invention to clean chemically manufactured articles efficiently.

It is yet another purpose of the present invention to reduce chemical process waste.

It is yet another purpose of the invention to reduce cleaning solvent contamination in chemical processing.

It is yet another purpose of the invention to reduce the volume of solvent required in chemical manufacturing.

It is yet another purpose of the invention to clean chemically processed articles efficiently, while reducing chemical waste caused by contamination.

It is yet another purpose of the invention to reduce the volume of solvent required in semiconductor processing.

It is yet another purpose of the invention to reduce the space required in semiconductor processing.

It is yet another purpose of the present invention to reduce semiconductor chip defects caused by contaminated chemical solvent.

SUMMARY OF THE INVENTION

The present invention is a cleaning apparatus for cleaning articles between chemical process steps in the manufacture of articles, which cleaning apparatus comprising: a vessel; a pressure control means for controlling the pressure within the vessel; a primary condensing means for condensing solvent vapor in the vessel; a means for controlling solvent volume in the vessel; and which has supports for supporting articles being cleaned in the vessel.

DESCRIPTION OF THE PREFERRED EMBODIMENTS

Figure 1:
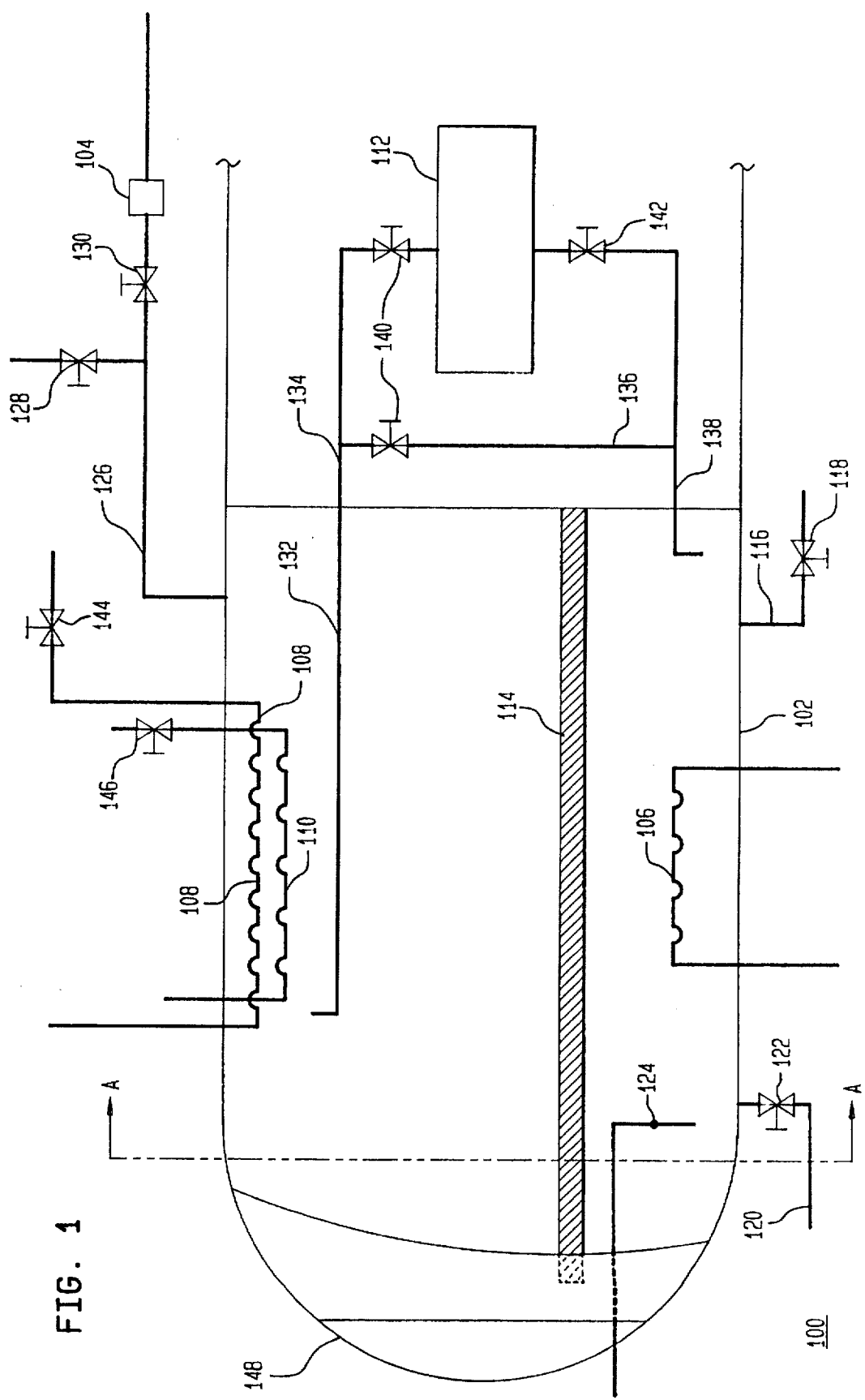
FIG. 1 is a cutaway representation of the cleaning apparatus of the present invention.

FIG. 1 is a cross sectional representation of the preferred embodiment cleaning system 100 of the present invention. The preferred embodiment system 100 has a pressurizable containment vessel 102, a pressure control pump 104, a heating element 106, a primary condensing coil 108, secondary condensing coils 110, a sealable storage reservoir 112 and, a support 114 for supporting articles to be cleaned. Fresh solvent is supplied to the vessel through supply line 116, when control valve 118 is open. Solvent is drained from the vessel through drain line 120 when drain control valve 122 is open. A fluid level sensor 124 (such as a float) senses whether the vessel's solvent level is above the heating element 106. Pressure within the vessel is adjusted through vent line 126. Internal vessel pressure is adjusted either by venting gas through pressure release valve 128 or by connecting the vessel to pressure control pump 104 through control valve 130. A collection tray (or trays) 132 collects solvent condensed by secondary condensing coil 110. The collected solvent is passed through return line 134 to sealable storage reservoir 112 or through bypass line 136 to return line 138 as determined by flow control valves 140. Stored solvent is provided to the vessel from storage reservoir 112 through return line 138 when valve 142 is open. Primary condenser control valve 144 controls the flow of coolant through primary condenser 108. Secondary condenser control valve 146 controls the flow of coolant through secondary condenser coils 110. A loading hatch 148 at one end of vessel 102 is for loading articles to be cleaned and unloading cleaned articles.

Figure 2:
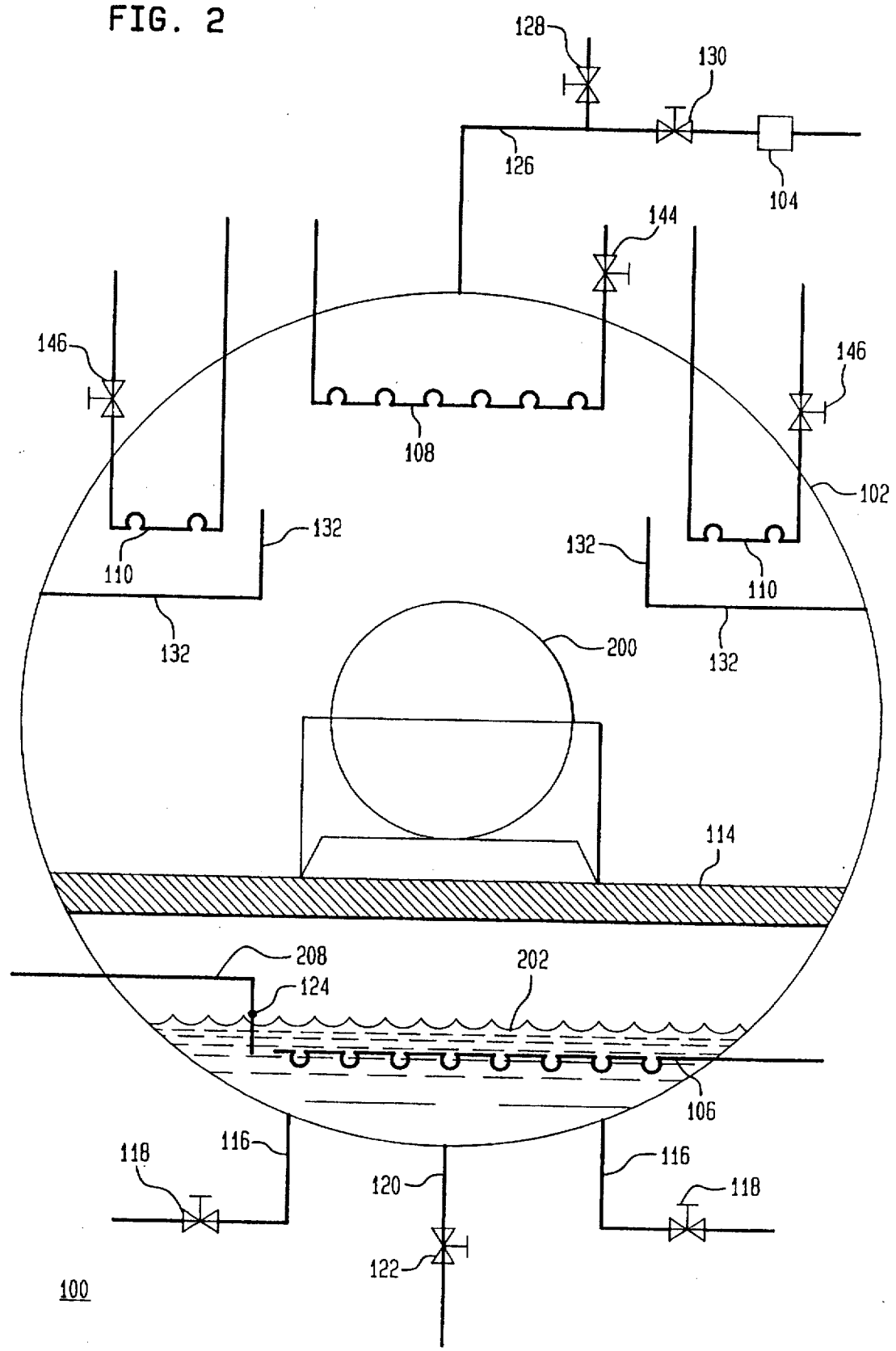
FIG. 2 is a representation of a cross section of the cleaning apparatus of FIG. 1 through A—A, with a semiconductor wafer positioned for cleaning.

To load an article into the vessel 102, the hatch 148 on the pressurizable containment vessel 102 is opened and the article (200 in FIG. 2) to be rinsed is loaded onto the support 114. The hatch 148 is closed and sealed. Rinsing solvent or solution 202 fills the vessel 102 through supply line 116 connected to the bottom of the vessel 102 until the rinsing solvent 202 covers the heating element 106. Fresh rinsing solvent 202 can be fed through the supply line 116. Alternatively, solvent can be supplied from the sealable reservoir 112 through return line 138 by opening valve 142. The cleaning solution level is monitored by a sensor 124, such as a float, that determines if the cleaning solution 202 covers the heating element 106, i.e., the required minimum solvent level during cleaning. The cleaning solution level is automatically maintained, responsive to the level sensor 124. Thus, when the float 124 drops below a minimum level, it activates control valve 118, adding solvent. Thus, the solution 206 covers the heating element 106 during cleaning.

Next, the internal pressure of the vessel is adjusted to set the boiling point for the selected cleaning solvent 202 and solute. In most cases, the solute is just the residual contamination from the article. Whether added intentionally or introduced as contamination from cleaning, the solvent changes the boiling point of the solution. So, the vessel's internal pressure is set above, below or at atmospheric pressure, accordingly. The heating element 106 is turned on after setting the pressure. Coincident with turning on the heating element 106, primary condenser control valve 144 is opened to allow cooling material (preferably, chilled water) to flow through the primary condensing coil 108. The flow rate of the cooling material is also adjustable to maintain the selected vessel pressure.

Figure 3:
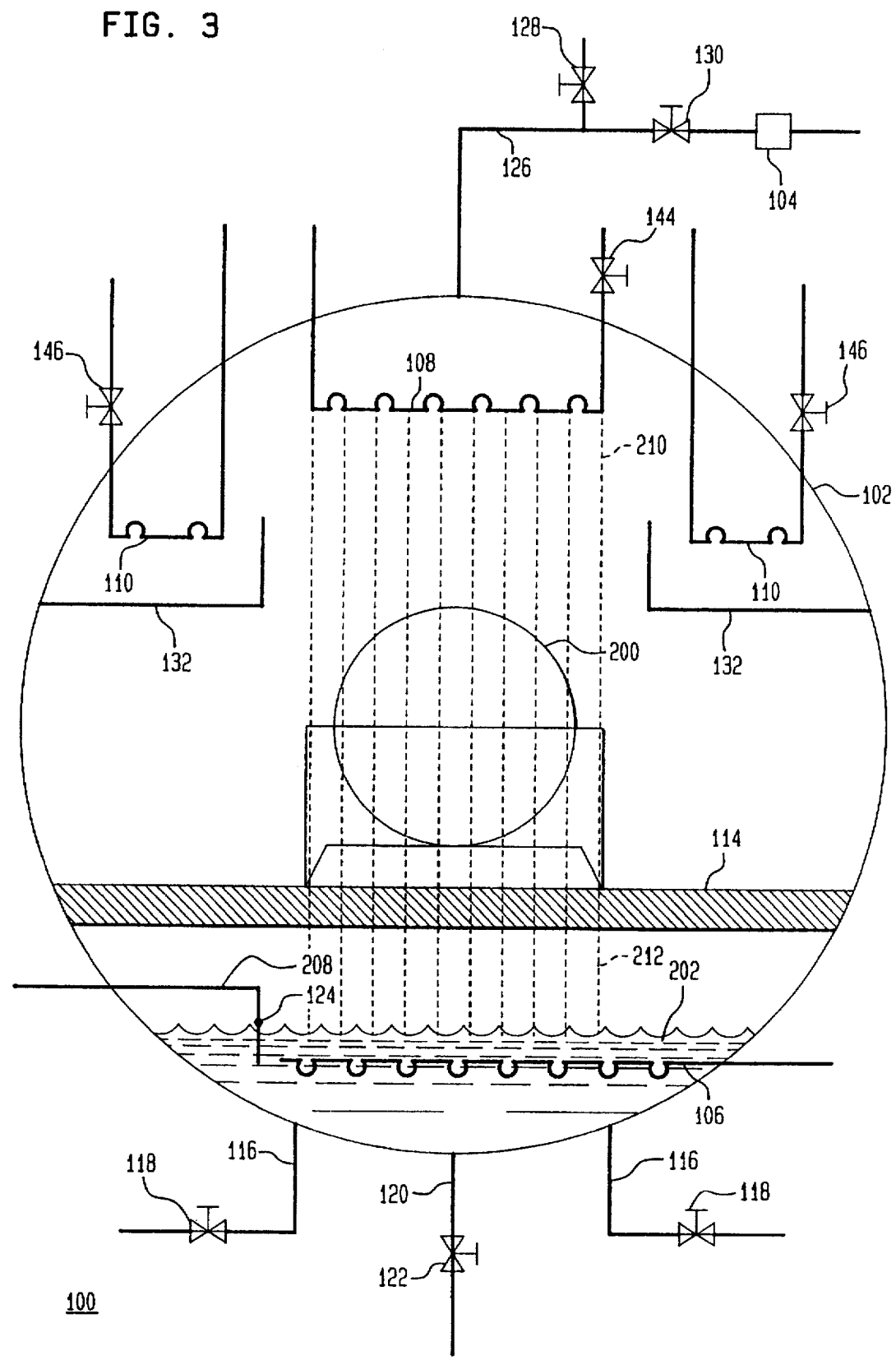
FIG. 3 represents cleaning the semiconductor wafer in the cleaning apparatus in FIG. 2.

The cleaning cycle begins when the solution 202 begins to boil, forming solvent vapor. At first, the solvent vapor condenses on both the article 200 and on the primary condensing coils 108. Solvent, condensed on the condensing coil 108, drops back onto the article 200 as represented in FIG. 3. The raining solvent drops 210 rinse the article 200, removing the unwanted residue and solute. The solution 212 formed on the article 200, falls into the solution 202 in the bottom of the vessel 102. Cleaning continues as the solution 202 boils, vapor cools and rains 210 onto the article 200. As solute is not carried with the solvent vapor, boiling the solution both distills the solvent and re-generates the solvent vapor. The raining solvent 210, which is cooler than the solvent vapor, cools the article 200 as it falls on it. Thus, the article's 200 temperature never rises to that of the solvent vapor. So, solvent vapor continues to condense directly on the article 200. This direct solvent condensation enhances the washing done by the solvent raining onto the article 200 and accelerates the rinse. Wash time depends on the article 200, residue, solvent, etc.

During the wash cycle, the entire process is done sealed inside the vessel. There is no solvent lost to the atmosphere during the wash. Nor is there solvent contamination from the atmosphere. Consequently, there are no additional costs from cleaning polluted air or from preventing air pollution.

Figure 4:
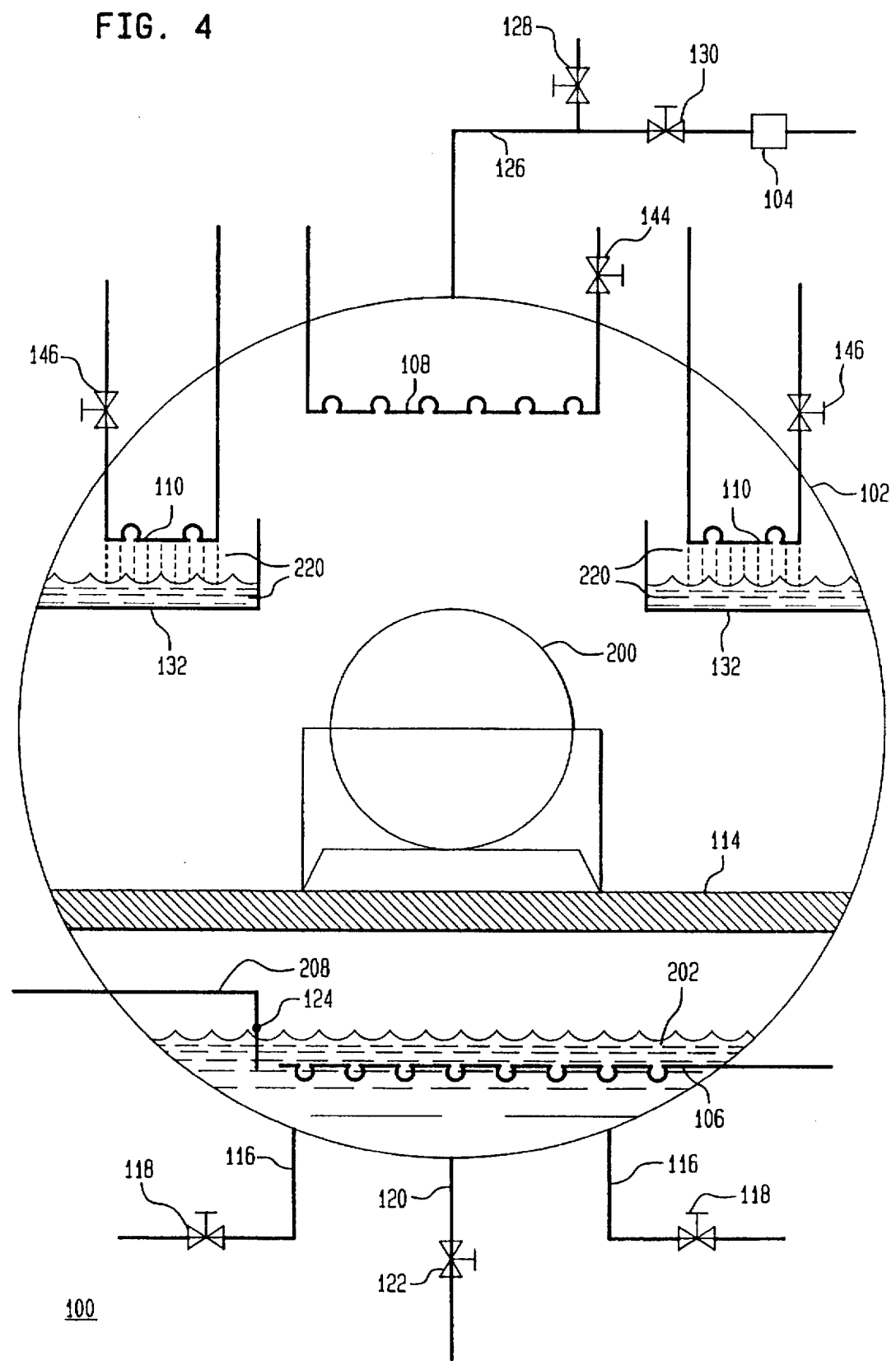
FIG. 4 represents drying the wafer cleaned in FIG. 3.

Once the article 200 has been washed, it must be dried. The primary condenser control valve 144 is closed to shut down condensing coil 108. Coincident with closing the primary condenser control valve 144, secondary condenser control valves 146 are opened allowing cooling material to flow through the secondary condensing coils 110. These secondary condensing coils 110 are located away from the article 200 and above a horseshoe-shaped collection tray 132. The solution continues to boil and solvent vapor condensing on the article 200 and on the primary condensing coil raises their temperature to that of the solvent vapor (ambient within the vessel). Solvent will no longer condense on the article 200 or on the primary condensing coil 108, but only on the secondary condensing coil 110 as represented in FIG. 4. Because its temperature rises to that of the solvent vapor, any moisture on the article 200 also evaporates so that the article dries in the vessel 102.

While the article 200 is drying, condensed solvent 220 from the secondary condensing coil 110 drops into the collection tray 132. The collected solvent 220 exits the vessel through line 134. Solvent exiting through line 134 is passed by the flow control valves 140 to either the sealed storage reservoir 112 or, to the bottom of the vessel through bypass line 136 and supply line 138. After the article 200 is dry, the heating element 106 is turned off. The secondary condensing coil 110 continues to condense solvent vapor. The cooled solvent is drained through line 134 to the sealable storage reservoir 112. The storage reservoir 112 is then sealed.

Finally, the vessel is returned to atmospheric pressure, the loading hatch 148 is opened and the cleaned article 200 is removed. Atmospheric contamination is minimized because no solvent vapor remains when the vessel is opened and because previously distilled solvent is sealed in the storage reservoir 112.

After removing the article 200, remaining solution (formed from the solvent and unwanted solute) can be emptied by opening drain control valve 122 and sent to a reprocessor or, preferably redistilled within the vessel 102. Re-distillation within the vessel 102 is done by: sealing the vessel 102; boiling the solution 202; condensing the solvent with the secondary condensing coils 110; collecting the condensed solvent 220; and, draining and storing the collected solvent in the sealable storage reservoir 112. This re-distillation can be repeated for any desired solvent purity, simply by removing solute from the vessel, refilling the vessel from the resealable storage container 112 and repeating the distillation steps. Improved re-distillation efficiency will result for a particular solution by proper selection of distillation trays 114. In all cases, vessel 102 internal pressure must be adjusted for optimum distillation. Thus, because solvent can be reclaimed through sealed distillation in the vessel, solvent waste is virtually eliminated over prior art cleaning techniques.

While the present invention is described herein in terms of preferred embodiments, numerous alterations and variations will occur to a person of ordinary skill in the art without departing from the spirit and scope of the present invention. It is intended that the appended claims include those variations and alterations that fall within the spirit and scope of the present invention.

We claim:

1. A cleaning and drying apparatus for cleaning residue from chemically manufactured articles between chemical process steps in the manufacture of said articles and for drying said cleaned articles, said cleaning and drying apparatus comprising:

a vessel;

pressure control means for controlling the pressure within said vessel;

primary condensing means in said vessel for condensing solvent vapor;

means for maintaining solvent level in said vessel;

purification means in said vessel for purifying contaminated solvent; and supports in said vessel for supporting articles being cleaned above said solvent level, said primary condensing means being located above said supports, whereby solvent condensed by said primary condensing means drops back onto said article, said solvent drops rinsing said article.

2. The cleaning and drying apparatus of claim 1 wherein the pressure control means comprises:

means for boiling solvent in said vessel; and evacuation means for reducing pressure in said vessel.

3. The cleaning and drying apparatus of claim 1 wherein said means for controlling solvent volume comprises:

supply means for adding fresh solvent to said vessel;

storage means for storing solvent;

storage return means for providing said stored solvent to said vessel; and recovery means in said vessel for returning purified solvent from said vessel to said storage means.

4. The cleaning and drying apparatus of claim 1 wherein the purification means comprises:

secondary condensing means in said vessel for precipitating solvent vapor; and collection means in said vessel for collecting said precipitated solvent.

5. The cleaning and drying apparatus of claim 1 wherein said storage means is sealable, whereby solvent contained in said storage means is not contaminated by atmospheric pollutants when said vessel is opened.

6. The cleaning and drying apparatus of claim 5 wherein the pressure control means comprises:

means in said vessel for boiling solvent; and evacuation means for reducing pressure in said vessel.

* * * * *